(12) United States Patent  
Tien et al.

(10) Patent No.: US 8,174,071 B2
(45) Date of Patent: May 8, 2012

(54) HIGH VOLTAGE LDMOS TRANSISTOR (75) Inventors: William Wei-Yuan Tien, Hsin-Chu (TW); Chao-Wei Tseng, Jhonghe (TW); Fu-Hsin Chen, Jhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 253 days.

(21) Appl. No.: 12/114,439

(22) Filed: May 2, 2008

(65) Prior Publication Data
US 2009/0273029 A1    Nov. 5, 2009

(51) Int. Cl.
*H01L 29/66* (2006.01)
(52) U.S. Cl. .......................... 257/343; 438/296
(58) Field of Classification Search .................. 257/343; 438/296
See application file for complete search history.

(56) References Cited

U.S. PATENT DOCUMENTS

| | | | |
|---|---|---|---|
| 5,512,495 A * | 4/1996 | Mei et al. | 438/286 |
| 5,548,147 A * | 8/1996 | Mei | 257/333 |
| 5,578,514 A * | 11/1996 | Kwon et al. | 438/286 |
| 5,585,294 A * | 12/1996 | Smayling et al. | 438/307 |
| 5,595,921 A * | 1/1997 | Villa et al. | 438/286 |
| 5,824,583 A * | 10/1998 | Asano et al. | 438/258 |
| 5,831,320 A * | 11/1998 | Kwon et al. | 257/409 |
| 5,844,275 A * | 12/1998 | Kitamura et al. | 257/335 |
| 6,093,588 A * | 7/2000 | De Petro et al. | 438/180 |
| 6,222,235 B1 * | 4/2001 | Kojima et al. | 257/355 |
| 6,242,787 B1 * | 6/2001 | Nakayama et al. | 257/493 |
| 6,492,678 B1 | 12/2002 | Hebert | |
| 6,531,355 B2 * | 3/2003 | Mosher et al. | 438/227 |
| 6,559,504 B2 * | 5/2003 | Nishibe et al. | 257/343 |
| 6,841,837 B2 * | 1/2005 | Inoue | 257/409 |
| 6,884,686 B2 * | 4/2005 | Pendharkar | 438/291 |
| 7,196,393 B2 * | 3/2007 | Suzuki et al. | 257/502 |
| 7,297,582 B2 * | 11/2007 | Abadeer et al. | 438/197 |
| 7,508,032 B2 * | 3/2009 | Chiang et al. | 257/345 |
| 7,541,247 B2 * | 6/2009 | Voldman | 438/294 |
| 7,696,049 B2 * | 4/2010 | Hu et al. | 438/289 |
| 7,704,842 B2 * | 4/2010 | Blanchard | 438/294 |
| 7,781,292 B2 * | 8/2010 | Gambino et al. | 438/294 |
| 7,824,977 B2 * | 11/2010 | Hu et al. | 438/218 |

(Continued)

FOREIGN PATENT DOCUMENTS

JP    2005-183633 A  *  7/2005

OTHER PUBLICATIONS

"Encyclopedia of RF and Microwave Engineering" ed. by K. Chang, v. 1, (C) 2005 John Wiley and Sons, p. 2160, chap. 7.5.2, lines 6-7.*

(Continued)

*Primary Examiner* — N Drew Richards
*Assistant Examiner* — Grant Withers
(74) *Attorney, Agent, or Firm* — Slater & Matsil, L.L.P.

(57) ABSTRACT

An LDMOS transistor structure and methods of making the same are provided. The structure includes a gate electrode extended on an upper boundary of an extension dielectric region that separates the gate electrode from the drain region of the LDMOS transistor. Moreover, at an area close to an edge of the extended gate electrode portion, the gate electrode further projects downwards into a convex-shaped recess or groove in the upper boundary of the extension dielectric region, forming a tongue. LDMOS transistors with this structure may provide improved suppression of hot carrier effects.

20 Claims, 10 Drawing Sheets

U.S. PATENT DOCUMENTS

| | | | | |
|---|---|---|---|---|
| 2001/0009288 | A1* | 7/2001 | Kojima et al. | 257/343 |
| 2002/0072159 | A1* | 6/2002 | Nishibe et al. | 438/179 |
| 2002/0197782 | A1* | 12/2002 | Kitamura | 438/200 |
| 2003/0001209 | A1* | 1/2003 | John et al. | 257/350 |
| 2003/0218211 | A1* | 11/2003 | John et al. | 257/347 |
| 2006/0192232 | A1* | 8/2006 | Ando | 257/288 |
| 2006/0223269 | A1* | 10/2006 | Honma | 438/294 |
| 2007/0018273 | A1* | 1/2007 | Miller et al. | 257/506 |
| 2007/0054464 | A1* | 3/2007 | Zhang | 438/424 |
| 2007/0108517 | A1* | 5/2007 | Wu et al. | 257/335 |
| 2008/0067588 | A1* | 3/2008 | Williams et al. | 257/343 |
| 2008/0090339 | A1* | 4/2008 | Herrick et al. | 438/151 |
| 2008/0246083 | A1* | 10/2008 | Tien et al. | 257/336 |
| 2008/0290411 | A1* | 11/2008 | Lee | 257/343 |
| 2008/0293206 | A1* | 11/2008 | Hu et al. | 438/297 |
| 2008/0308862 | A1* | 12/2008 | Theeuwen et al. | 257/328 |
| 2009/0032870 | A1* | 2/2009 | Iida | 257/339 |
| 2009/0072308 | A1* | 3/2009 | Chen et al. | 257/336 |
| 2009/0096022 | A1* | 4/2009 | Chang et al. | 257/343 |
| 2009/0101990 | A1* | 4/2009 | Kang et al. | 257/379 |
| 2009/0166736 | A1* | 7/2009 | Park, II | 257/343 |
| 2009/0221118 | A1* | 9/2009 | Chen et al. | 438/275 |
| 2009/0256212 | A1* | 10/2009 | Denison et al. | 257/408 |
| 2010/0006935 | A1* | 1/2010 | Huang et al. | 257/341 |
| 2010/0052057 | A1* | 3/2010 | Chung et al. | 257/362 |
| 2010/0078715 | A1* | 4/2010 | Lee | 257/330 |
| 2010/0140701 | A1* | 6/2010 | Kim | 257/343 |
| 2010/0221884 | A1* | 9/2010 | Tanaka | 438/286 |
| 2010/0270614 | A1* | 10/2010 | Croce et al. | 257/337 |

OTHER PUBLICATIONS

Pan, et al., "A Low Voltage to High Voltage Level Shifter Circuit for MEMS Application," Proceedings of the 15th Biennial University/Government/Industry Microelectronics Symposium, 2003, pp. 128-131, IEEE.

* cited by examiner

HIGH VOLTAGE LDMOS TRANSISTOR

TECHNICAL FIELD

The present invention relates generally to structures of high voltage LDMOS transistors and methods of making the same, and more particularly to high voltage LDMOS transistors with a gate electrode projection, and methods of fabricating the same.

BACKGROUND

High voltage MOS transistors are semiconductor devices that can operate with high terminal voltages. High-voltage integrated circuits (ICs) that include high voltage MOS transistors are widely used in applications for the automobile industry, display drivers, portable telecommunication devices, medical equipment, and other areas. As an example, high voltage (e.g., greater than 20 volts) MOS transistors are integrated into a gate driver IC to deliver display signals to a liquid crystal display (LCD) panel. However, with the continuous process shrinking in advanced technology, breakdown voltages of these high voltage MOS transistors are also reduced.

Electric breakdown in MOS transistors is a well recognized problem. The breakdown phenomena generally escalate as the space between the source and drain regions continues to narrow in MOS transistors made by advanced processing technology, stemming from increased electric fields in the channel region. Known breakdown mechanisms in an MOS transistor include junction breakdown, punchthrough breakdown, and snapback breakdown. As an example, snapback breakdown occurs near the drain region in an NMOS transistor during saturated operation (e.g., the transistor is turned on). When a voltage is applied on the drain, a lateral electric field is presented in the channel region of the transistor and a peak electric field occurs near the drain region. The high electric field accelerates the electrons in the channel region and causes the electrons to gain enough kinetic energy to become "hot" near the edge of the N+ drain region. The "hot" electrons cause impact ionization of materials near the drain edge and create electron-hole pairs. Electrons will inject into the gate oxide, and some of the injected electrons may become trapped in the gate oxide layer. This so-called hot carrier effect may cause various problems in a MOS transistor. The trapped electrons may cause the threshold voltage (Vt) of an NMOS transistor to undergo an undesirable shift to the positive side. The hot carrier effect may also lead to long term device degradation and reduced reliability. Under extreme circumstances, snapback breakdown may even cause permanent physical damage in the gate oxide.

SUMMARY OF THE INVENTION

These and other problems are generally solved or circumvented, and technical advantages are generally achieved, by preferred embodiments of the present invention which provide an LDMOS transistor comprising a gate electrode extended on an upper boundary of a dielectric region that separates the gate electrode from the drain region of the LDMOS transistor. Moreover, at an area close to an edge of the extended portion, the gate electrode further projects downwards into a convex-shaped recess or groove in the upper boundary of the dielectric region, forming a tongue. LDMOS transistors with this structure may provide improved suppression of hot carrier effects.

In accordance with a preferred embodiment of the present invention, a MOS transistor disposed in a semiconductor substrate comprises a source region of a first conductivity type disposed in a first surface portion of the substrate, a drain region of the first conductivity type disposed in a second surface portion of the substrate, and a channel region of a second conductivity type opposite the first conductivity type disposed in a third surface portion of the substrate between the source region and the drain region. The MOS transistor also comprises a gate dielectric layer disposed over the channel region, and an extension dielectric region laterally adjacent to and between the gate dielectric layer and the drain region. The MOS transistor further comprises a drain extension region of the first conductivity type surrounding the drain region and the lower portion of the extension dielectric region, and a gate electrode having a first portion on the gate dielectric layer and a second portion on the upper surface of the extension dielectric region, wherein the second portion includes an projection into the upper surface of the extension dielectric region.

In accordance with another preferred embodiment of the present invention, a MOS transistor disposed in a semiconductor substrate comprises a source region of a first conductivity type disposed in a first surface portion of the substrate, a drain region of the first conductivity type disposed in a second surface portion of the substrate, and a channel region of a second conductivity type opposite the first conductivity type disposed in a third surface portion of the substrate between the source region and the drain region. The MOS transistor also comprises a gate dielectric layer disposed over the channel region and an extension dielectric region laterally adjacent to and between the gate dielectric layer and the drain region, the extension dielectric region having a convex-shaped recess on an upper surface. The MOS transistor further comprises a drain extension region of the first conductivity type surrounding the drain region and the lower portion of the extension dielectric region, and a gate electrode covering the gate dielectric layer and a portion of the extension dielectric region, and completely filling the convex-shaped recess.

In accordance with a further preferred embodiment of the present invention, a MOS transistor disposed in a semiconductor substrate comprises a source region of a first conductivity type disposed in a first surface portion of the substrate, a drain region of the first conductivity type disposed in a second surface portion of the substrate, a channel region of a second conductivity type opposite the first conductivity type disposed in a third surface portion of the substrate between the source region and the drain region, and a gate dielectric layer disposed over the channel region. The MOS transistor also comprises a first extension dielectric region laterally adjacent to and between the gate dielectric layer and the source region, the first extension dielectric region having a portion extending into the substrate, and a second extension dielectric region laterally adjacent to and between the gate dielectric layer and the drain region, the second extension dielectric region having a portion extending into the substrate. The MOS transistor further comprises a source extension region of the first conductivity type surrounding the source region and the lower portion of the first extension dielectric region, and a drain extension region of the first conductivity type surrounding the drain region and the lower portion of the second extension dielectric region. The MOS transistor further even further comprises a gate electrode having a first portion on the upper surface of the first extension dielectric region and a second portion on the upper surface of the second extension dielectric region, wherein the first portion includes a first projection into the first extension dielectric region, and the second portion includes a second projection into the second extension dielectric region.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a high voltage LDMOS transistor having a novel structure to suppress hot carrier effect, and the method of forming the same. Embodiments of the present invention may also be applied, however, to other transistor structures and methods of fabrication thereof. While only one transistor is shown in each figure, there may be many transistors formed simultaneously on a single semiconductor workpiece.

Figure 1:
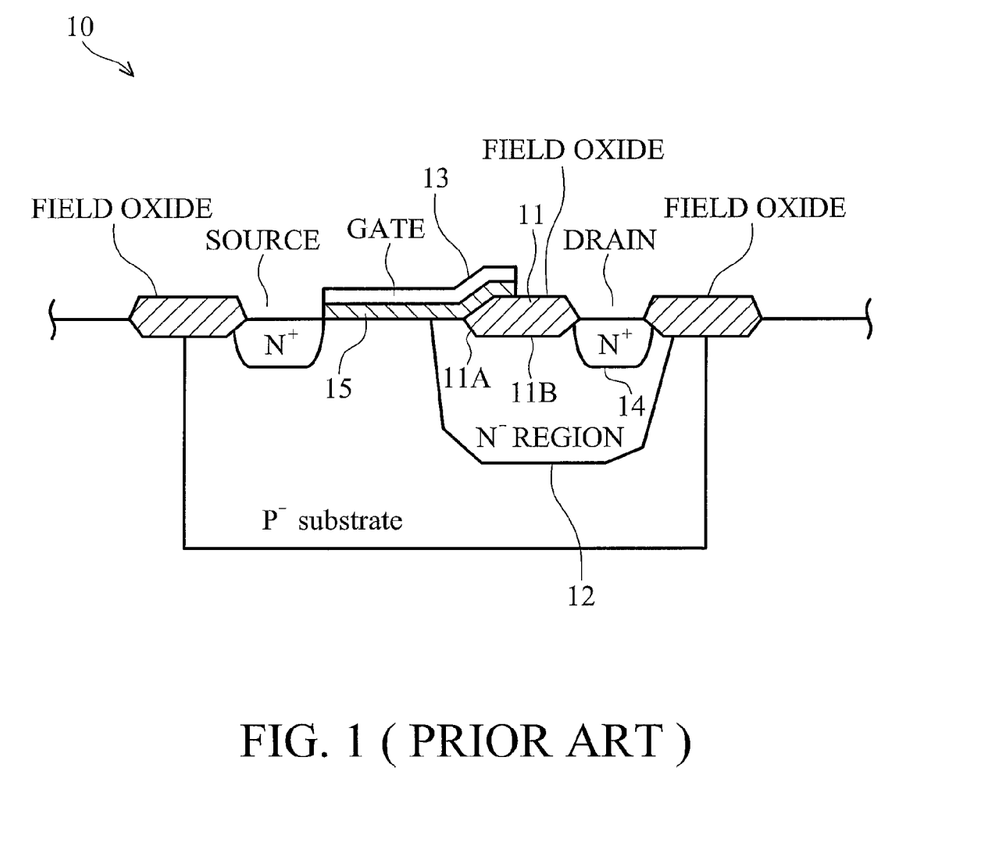
FIG. 1 is a cross-sectional view of a prior art high voltage LDMOS transistor.

FIG. 1 shows a cross-sectional view of a prior art high voltage MOS (HVMOS) transistor 10. Transistor 10 has a typical Lateral-Diffused-Metal-Oxide-Semiconductor (LDMOS) transistor configuration for high-voltage (e.g., >30 volts) applications. Two distinct features are formed in transistor 10 for suppressing device breakdown. First, a lightly doped N-region 12 is formed as an extension of the highly doped N+ drain region 14 of HVMOS transistor 10. The lightly doped N– region 12 is commonly referred to as an N– extension region or N– drift region. The N– extension region 12 formed between the P-type channel and the N+ drain region 14 results in a more graded N-type impurity profile. Second, thick field oxide 11 is formed over N– extension region 12, and a portion of gate 13 is formed along the upper edge of thick field oxide 11. The thick field oxide 11 is applied to reduce the electric field near the drain region.

The N– extension region 12 along the lower boundary 11B of field oxide 11 between the N+ drain 14 and gate 13 absorbs some voltage applied on the drain, when transistor 10 is turned on, and reduces the peak electric field near the N+ drain 14 edge. This, in turn, will suppress the snapback breakdown near the drain edge. However, when the device feature size further reduces (e.g., smaller than 0.6 µm), the electric field in the channel region intensifies significantly and peaks at a location near bird's beak 11A of field oxide 11, close to the substrate surface. In consequence, the detrimental effects of snapback breakdown and hot carrier injection, which are prone to occur near bird's beak 11A, need to be addressed through improved transistor structures and methods of fabricating the same.

Figure 2A:
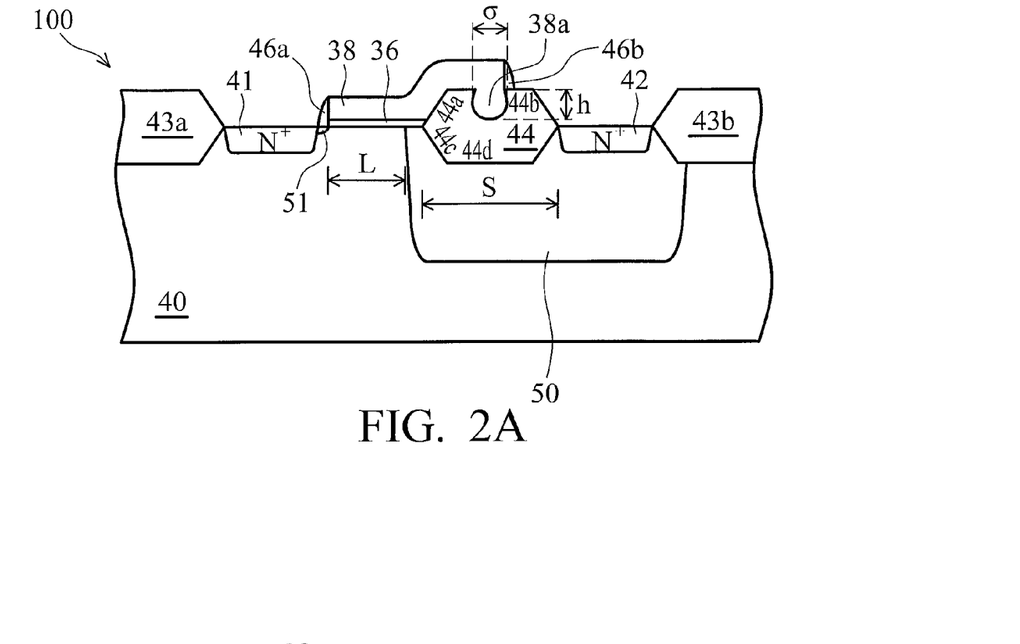
FIG. 2A is a cross-sectional view of an illustrative embodiment of a high voltage LDMOS transistor with gate electrode projection region.

FIG. 2A illustrates a cross-sectional view of a preferred embodiment of the present invention. An N-channel enhanced mode, high voltage LDMOS transistor 100 is formed on a bulk substrate 40 of P-type monocrystalline silicon having a low dopant concentration from approximately $10^{11}$ cm$^{-3}$ to approximately $10^{12}$ cm$^{-3}$. Alternatively, substrate 40 could be a P-type semiconductor layer, such as a P-well, formed on a semiconductor workpiece, and the workpiece may also include other active/passive components or circuits. Substrate 40 may include other semiconductor materials such as compound semiconductors, GaAs, InP, Si/Ge, used in place of silicon. Substrate 40 may also be disposed on an insulating layer in a silicon-on-insulator (SOI) wafer configuration.

Thick insulating regions 43a, 43b, and 44 are disposed in substrate 40, as shown, and may comprise an oxide or nitride material, as examples. Thick insulating regions 43a and 43b are typically used to isolate LDMOS transistor 100 from adjacent components (not shown) on substrate 40. Thick insulating region 44 having a lateral dimension S is formed to reduce the electric field near the drain region 42 of LDMOS transistor 100. In this embodiment, field oxide is used as insulating regions 43a, 43b, and 44, and has a thickness of about 5.0 µm. In other embodiments, field oxide regions 43a, 43b, and 44 have a thickness from about 4.0 µm to about 7.0 µm. These field oxide regions may extend to a depth from about 1.5 µm to about 3.0 µm in substrate 40.

Two N+ diffused regions 41 and 42 are disposed in substrate 40, adjacent to insulating regions 43a, and 43b, respectively. Diffused regions 41 and 42 act as the source and drain of LDMOS transistor 100. The dopant concentration of N+ diffused regions 41 and 42 is selected to have high conductivity for good ohmic contact with the substrate 40 and may be doped with an appropriate material, such as phosphorous or arsenic to a doping concentration from about $10^{14}$ cm$^{-3}$ to about $10^{16}$ cm$^{-3}$ although other N type doping materials and doping concentrations may be used. In preferred embodiments, the N+ diffused regions 41 and 42 may extend to a depth from about 0.5 µm to about 0.8 µm in substrate 40.

N– region 50 is disposed in substrate 40 on the drain side, acting as the N– extension region of the N+ drain region 42. The doping profile of N– extension region 50 is selected so that it completely surrounds the portions of N+ drain region 42 and field oxide region 44 extending under the substrate surface. The doping concentration of N– extension region 50 is chosen to obtain the desired beneficial results. As an example, doping concentration of N– extension region 50 is preferably not so high as to induce junction breakdown between the N– extension region 50 and the P-type substrate 40, and not so low as to cause punchthrough breakdown in the substrate, when high voltages are applied on N+ drain region 42 during device operation. In preferred embodiments, the dopant concentration of the N– extension region 50 is selected from about $10^{12}$ cm$^{-3}$ to about $10^{13}$ cm$^{-3}$, with an appropriate N-type material, such as phosphorous or arsenic, although other N type doping materials and doping concentrations may be used. The N− extension region 50 may extend to a depth of from about 1.5 μm up to about 5.0 μm in substrate 40, so that it completely surround the portion of N+ source 42 and field oxide region 44, as described above.

A thin gate dielectric layer 36 of thermal silicon dioxide having a thickness of about 700 Å is provided on the surface of substrate 40. In other embodiments, gate dielectric layer has a thickness from about 200 Å to about 800 Å, made of silicon dioxide or other suitable gate dielectric materials. Gate dielectric layer 36 extends from a location adjacent to an edge of the N+ source region 41, along the substrate surface, to a location abutting an edge of field oxide region 44. A gate polysilicon (poly) layer 38 is preferably provided over the gate dielectric layer 36 as the gate electrode of LDMOS transistor 100, although other suitable gate electrode materials, such as metal or metal alloy, may be used. Gate poly layer 38 extends from a location aligned with gate dielectric layer 36 at one end close to N+ source region 41, along the top surface of gate dielectric layer 36 and an exposed surface 44a of the bird's beak of field oxide region 44, to a location on the upper boundary 44b of field oxide region 44. Preferably, gate poly layer 38 extends on field oxide region 44 to a location of about 50% of the lateral dimension S of field oxide region 44. A thickness of about 3500 Å is used for gate poly layer 38 in the current embodiment. In other embodiments, the thickness of gate poly layer 38 is from about 2000 Å to about 5000 Å. Alternatively, a stacked layer structure may be used for gate poly layer 38 that includes a $WSi_x$-Poly (tungsten silicide over polysilicon) configuration with the $WSi_x$ thickness from about 800 Å to about 1800 Å. Generally, LDMOS transistor 100 has an asymmetric configuration due to its unique gate profile.

A particular feature of gate poly layer 38 in the current embodiment or in other preferred embodiments is illustrated in FIG. 2A. At a location near an edge of the portion that extends onto the upper boundary 44b of field oxide region 44, gate poly layer 38 projects downwards into a convex-shaped recess or groove in field oxide region 44, forming poly tongue 38a. In the current embodiment, the width "σ" and depth "h" of tongue 38a are about the same, and have a dimension of about 300 Å. In other preferred embodiments, width "σ" is within the range from about 100 Å to about 500 Å, and depth "h" is within the range from about 200 Å to about 600 Å. It is also noted that tongue 38a preferably has a convex-shaped profile. An angular profile such as a trench or an axe profile may be used, but is generally not preferred, because it may lead to an undesirable strong local electrical field when LDMOS transistor 100 is in operation. Furthermore, in the current embodiment, the acute angle between bird's beak 44c of field oxide region 44 and the substrate 40 surface is about 45 degrees. In other preferred embodiments, the angle is between about 30 degrees and about 60 degrees.

A channel region L extends along the substrate surface, between the facing edges of N+ source region 41 and N− extension region 50. Spacer 46a is provided on one edge of gate dielectric layer 36 and gate poly layer 38 to cover the corner between the edge sidewall and the substrate 40. Spacer 46b is provided on the other edge of gate poly layer 38 to cover the corner between the edge side wall and the upper boundary 44b of field oxide region 44. Spacers 46a and 46b have a base dimension from about 300 Å to about 2000 Å. TEOS silicon dioxide is preferably used to make spacers 46a and 46b, although other suitable spacer dielectric materials such as $Si_3N_4$ and other spacer dimensions may also be used. Alternatively, a shallow, lightly-doped N− region 51, similar to the well known lightly-doped drain (LDD) region in a conventional short channel NMOS transistor, may be formed under spacer 46a, adjoining N+ source region 41.

Figure 2B:
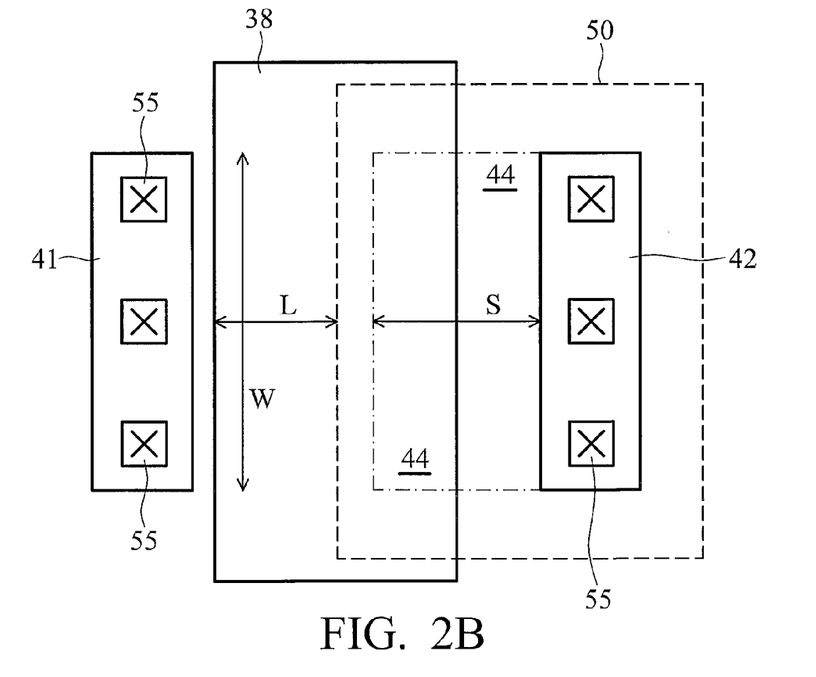
FIG. 2B is a top view of the high voltage LDMOS transistor in accordance with FIG. 2A.

FIG. 2B is a top view of LDMOS transistor 100, wherein N− extension region 50, N+ source region 41, N+ drain region 42, gate poly layer 38, field oxide region 44, and contacts 55 are shown. Also illustrated in FIG. 2B are dimensions of LDMOS transistor 100, including channel length L, channel width W, and the lateral dimension S of field oxide region 44. In the current embodiment, L is about 3.0 μm, W is about 20.0 μm, and S is about 3.0 μm. An off-breakdown voltage (breakdown voltage measured on drain terminal before LDMOS transistor 100 is turn on) of about 60.0 volts is obtained. In other embodiments, LDMOS transistors are fabricated having an L in a range from about 3.0 μm to about 100.0 μm, W in a range from about 3.0 μm to a few hundred microns, and S in a range from about 1.0 μm to about 85.0 μm. Off-breakdown voltages off the embodied LDMOS transistors range from about 35.0 volts to about 850.0 volts.

Figure 3:
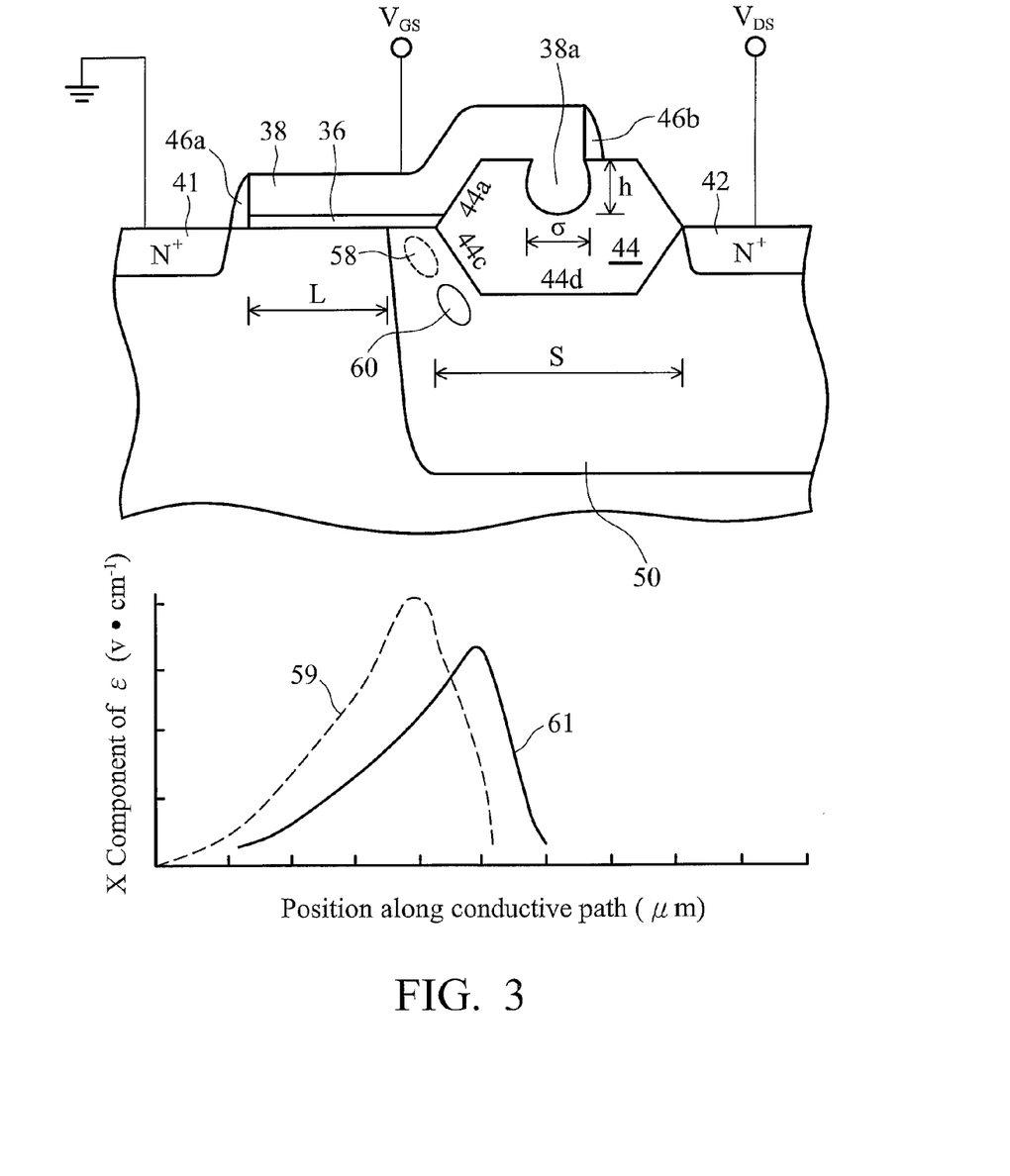
FIG. 3 is an enlarged cross-sectional view of a portion of the high voltage LDMOS transistor of FIG. 2A.

FIG. 3 is an enlarged cross-sectional view of a portion of LDMOS transistor 100, when LDMOS transistor 100 is turned on and operates under saturated mode, as is the case in many high voltage applications. Gate-to-source voltage $V_{GS}$ and drain-to-source voltage $V_{DS}$ of about 30 volts are respectively applied on gate poly layer 38 and N+ drain region 42. N+ source region 41 is typically grounded. Under this or similar bias conditions, an electrical field is built up between source region 41 and drain region 42, along a conductive path including channel region L, bird's beak 44c and lower boundary 44d of field oxide region 44. The electric field peaks at region 60 (solid oval) in N− extension region 50, near bird's beak 44c. When the local electric field peak exceeds a predetermined threshold value, snapback breakdown may take place, which may, in turn, lead to hot carrier injection into gate dielectric layer 36. Simultaneously illustrated in FIG. 3 is region 58 (ghost oval) in N− extension region 50, near bird's beak 44c. Region 58 represents electric field peak region of a prior art LDMOS transistor counterpart without gate poly tongue 38a formed in a field oxide recess, with the LDMOS transistor counterpart being under similar operating conditions as to LDMOS transistor 100. Also plotted in FIG. 3 are magnitudes of the electrical field as a function of the distance along the mentioned conductive path. Solid line 61 and dashed line 59 correspond, respectively, to the lateral component of the electrical field ($\epsilon$) in LDMOS transistor 100 and in its LDMOS transistor counterpart. It is revealed that the LDMOS transistor 100 structure of the current embodiment leads to a weaker electrical field near bird's beak 44c, compared to its counterpart with similar device dimensions under similar operating conditions. It is also revealed that the snapback breakdown region of LDMOS transistor 100 is pushed far below the substrate surface, which, in turn, reduces the possibility of hot carriers reaching the gate dielectric layer 36.

Remaining in FIG. 3, in the current embodiment where LDMOS transistor 100 is under a saturated operational mode, the peak electrical field and the location of a snapback breakdown are affected by a number of device and process parameters. These parameters include channel length L, profile and dimensions of field oxide region 44, profile and dimensions of tongue 38a of gate poly layer 38, doping concentration of substrate 40, and doping concentration of N− extension region 50, among others. In general, a large L and S, and a deep extension of field oxide region 44 into substrate 40 create a longer conductive path between N+ source region 41 and N+ drain region 42. Because the electric field is a function of both voltage and distance, a longer conductive path serves to decrease the peak electric field in the conducting channel near bird's beak 44c. Additionally, the location of breakdown region 60 is significantly influenced by the dimensions and profiles of tongue 38a and field oxide region 44. More specifically, tongue 38a preferably has a convex-shaped profile in order to avoid a buildup of a strong local electrical field. In preferred embodiments, when the acute angle between bird's beak 44c and the surface of substrate 40 is within the range from about 30 degrees to about 60 degrees, and when width "σ" and depth "h" of tongue 38a are within the range from about 100 Å to about 500 Å, and the range from about 200 Å to about 600 Å, respectively, the breakdown region 60 remains in a desirable location near the corner of bird's beak 44c and the lower boundary 44d of field oxide region 44, far below the surface of substrate 40, as shown.

Figure 4A:
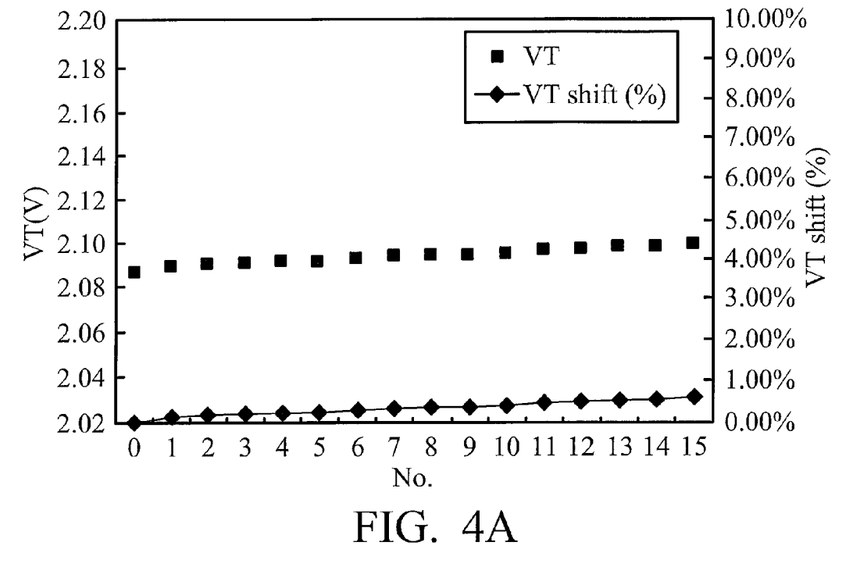
FIGS. 4A and 4B compare the threshold voltage shift due to hot carrier effect in an embodiment LDMOS transistor with that in a prior art counterpart.
Figure 4B:
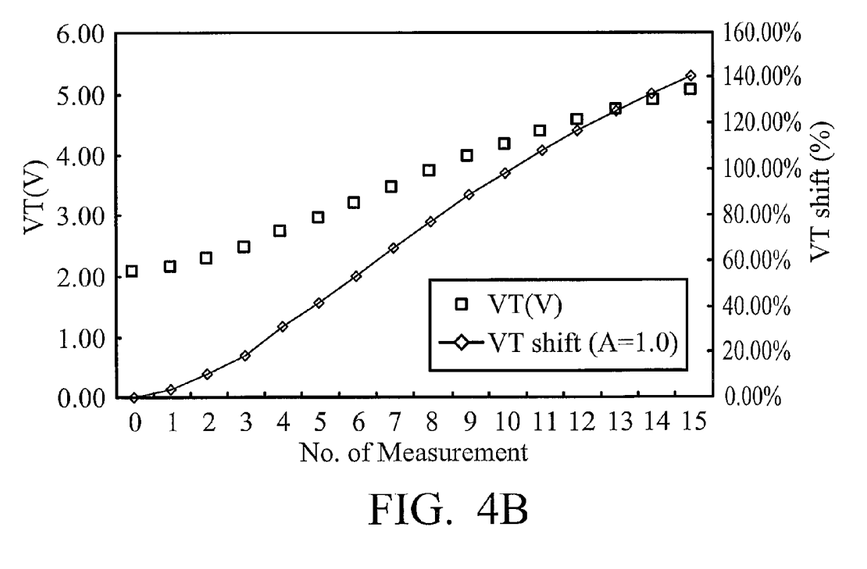

FIGS. 4A and 4B compare threshold voltage (Vt) shift on LDMOS transistor 100 of the current embodiment with that in a prior art counterpart, as described with respect to FIG. 3. Initial Vt is measured on LDMOS transistor 100 and its counterpart by use of known Vt measuring techniques. Initial Vt of about 2.08 volts are recorded on both LDMOS transistors. Stress gate and drain voltages higher than the operational voltages may be applied on LDMOS transistor 100 and its counterpart, inducing a snapback breakdown and accelerating the process of Vt shift due to hot carrier injection into gate dielectric layer. After the stress, Vt is again measured and recorded on LDMOS transistor 100 and its counterpart. This process may repeat a plurality of times until statistical analysis can be made on the measured data. Vt and Vt shift after each stress on LDMOS transistor 100 and its counterpart are recorded and plotted as shown. In FIGS. 4A and 4B, the horizontal axis represents the number of stress tests conducted on LDMOS transistor 100 and its counterpart, while the left-hand vertical axis represents threshold voltage Vt measured thereon. The solid and empty square points represent, respectively, Vt measured on LDMOS transistor 100 and its counterpart after each stress. The right-hand vertical axis of FIGS. 4A and 4B represents the cumulative Vt shift (in percentage) with respect to the initial Vt. The solid and empty diamond points represent, respectively, Vt shift on LDMOS transistor 100 and its counterpart after each stress. It is revealed from FIGS. 4A and 4B that, after fifteen stress tests, Vt of the prior art LDMOS transistor shifted from about 2.08 volts to about 5.0 volts, greater than 140%, while Vt on LDMOS transistor 100 of the preferred embodiment remains virtually unchanged. FIGS. 4A and 4B clearly demonstrate the effectiveness of the embodied LDMOS transistor structure in suppressing device degradation due to hot carrier effect.

FIGS. 5A-5F are cross-sectional views of process steps for fabricating high voltage LDMOS transistor 100 described above. To clarify description and avoid repetition, like numerals and letters used to describe LDMOS transistor 100 above are used for the various elements in the coming figures. Also, reference numerals described previously may not be described again in detail herein.

Figure 5A:
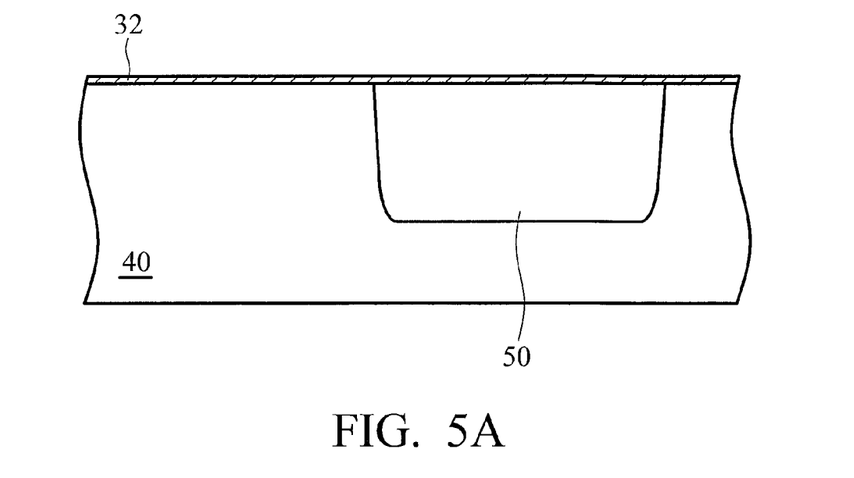
FIGS. 5A-5F are cross-sectional views of process steps for the fabrication of an embodiment of a high voltage LDMOS transistor.

FIG. 5A shows the initial process steps during which a layer of screen oxide 32 is grown atop a portion of P-type substrate 40. A first photolithography process is applied to the surface of oxide layer 32 to form photoresist pattern (not shown) for selective implantation of N-type dopants. The N-type dopants are then driven into P-type substrate 40 by a thermal process to form N− extension region 50. The N− extension region 50 forms an extension of the drain of an N-channel enhanced mode, high voltage LDMOS transistor to be formed subsequently. N− extension region 50 thus formed has a doping concentration from about $10^{12}$ cm$^{-3}$ to about $10^{13}$ cm$^{-3}$. In other preferred embodiments, N-extension region 50 is formed by phosphorus diffusion. The N− extension region 50 may extend to a depth of from about 1.5 μm up to about 5.0 μm in P-type substrate 40.

Figure 5B:
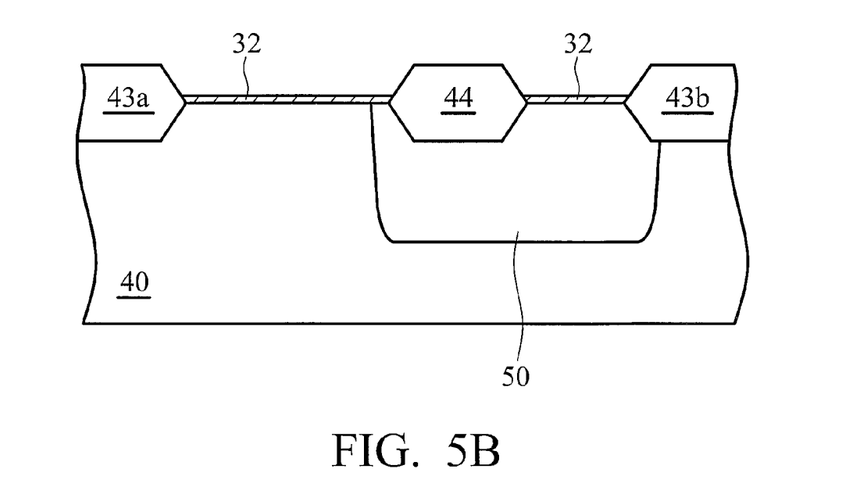

Continuing in FIG. 5B, selective oxidation may be performed to form field oxide regions 43a, 43b, and 44. The field oxide regions have a thickness from about 4.0 μm to about 7.0 μm, and may extend to a depth from about 1.5 μm to about 3.0 μm in P-type substrate 40. Field oxide regions 43a and 43b surround the LDMOS transistor to be formed to isolate it from neighboring devices on the same substrate. Field oxide region 44 is formed to reduce the electrical field near the drain region of the LDMOS transistor to be formed.

Figure 5C:
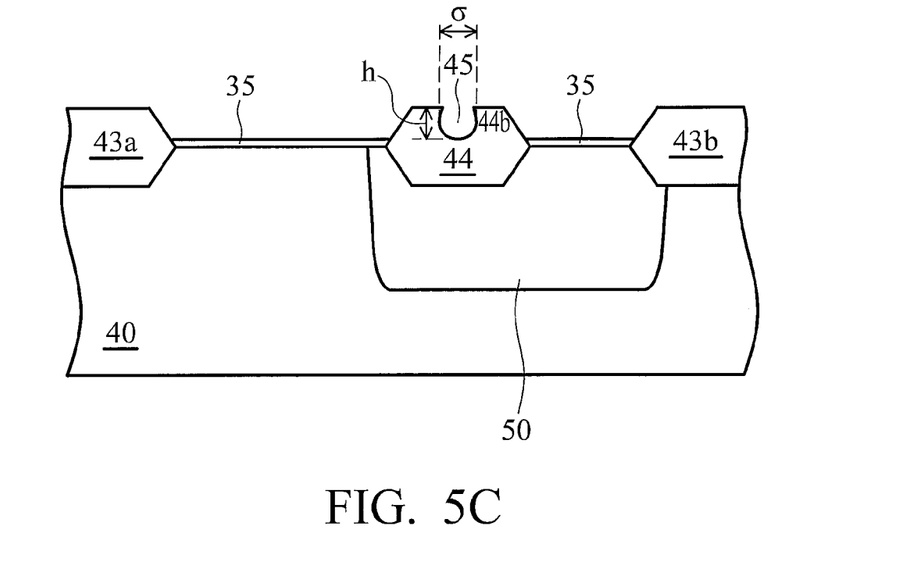

Subsequently, an etch process is applied to form convex-shaped recess 45 on upper boundary 44b of field oxide region 44, as shown in FIG. 5C. In preferred embodiments, an isotropic etch process, such as a wet etch process, is used to form convex-shaped recess 45. Convex-shaped recess 45 thus formed has a width "σ" within the range from about 100 Å to about 500 Å, and depth "h" within the range from about 200 Å to about 600 Å. Screen oxide layer 32 is removed from the substrate by another etch process, and a thermal oxide 35 of thickness from about 200 Å to about 800 Å is grown on the substrate.

Figure 5D:
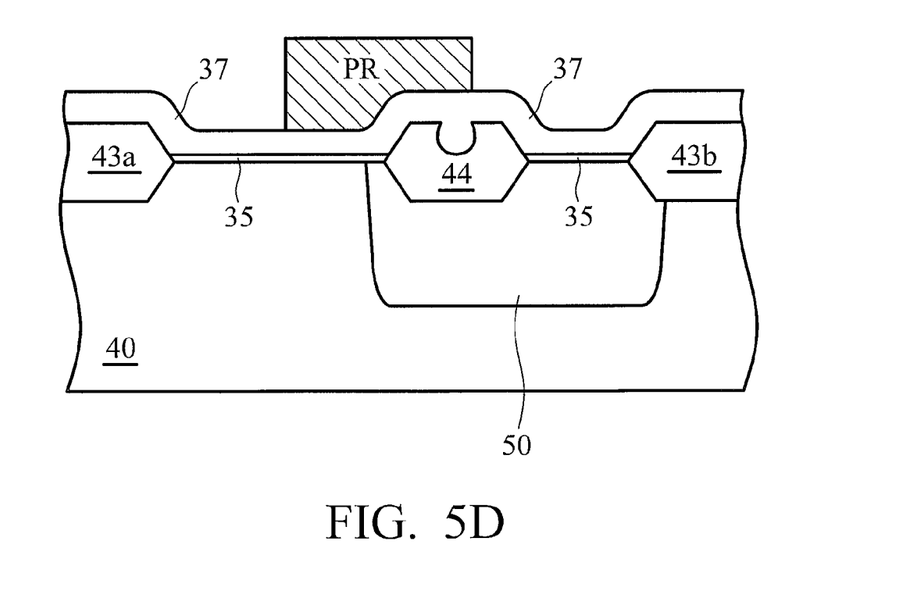

Continuing in FIG. 5D, a poly layer 37 having a thickness from about 2000 Å to about 5000 Å is formed on the substrate, including poly extension in convex-shaped recess 45 on the upper boundary of field oxide region 44. A chemical vapor deposition (CVD) process may be used to form poly layer 37, although other suitable processes may be used. A second photolithography process is applied to form photoresist pattern (labeled as "PR") for creating a gate electrode of the LDMOS transistor to be formed.

Figure 5E:
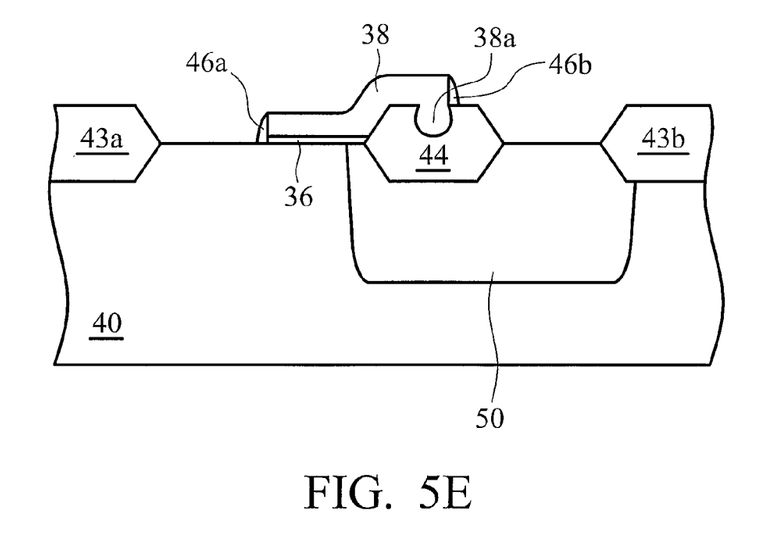

Shown in FIG. 5E, an anisotropic etch process, such as a plasma dry etch process, is applied to the substrate, creating poly gate electrode 38 and gate dielectric layer 36. After the gate is created, a TEOS oxide film of thickness from about 500 Å to about 3000 Å is deposited on the substrate. A dry-etch process is then applied to the substrate, which removes the oxide from the flat areas while leaving gate spacers 46a and 46b at the sidewalls of the gate. Other spacer dielectric materials, such as $Si_3N_4$, can also be used. Alternatively, prior to the formation of gate spacers 46a and 46b, a shallow and lightly doped N-type region (not shown) may be formed between the edges of field oxide region 43a and poly gate electrode 38, and between the edges of field oxide region 44 and 43a.

Figure 5F:
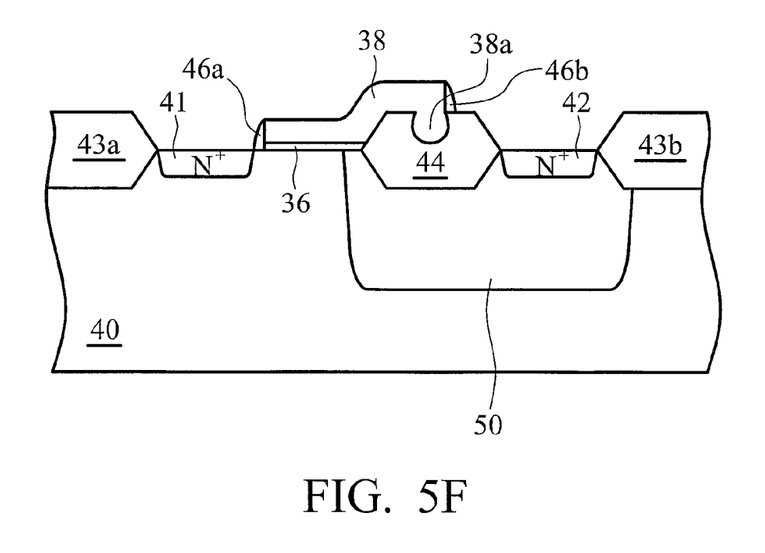

Shown in FIG. 5F, after spacer formation, a heavy and deep N-type ion implantation is conducted to form N+ source region 41 and N+ drain region 42. Preferably, this is a self-aligned process where the edges of N+ source region 41 are defined by the patterning of field oxide region 43a and gate spacer 46a, and the edges of N+ drain region 42 are defined by the patterning of field oxide region 44 and 43b. A silicide layer may be selectively formed on the top surface of the N+ source/drain regions 41, 42, and poly gate electrode 38 to reduce the resistance of the source/drain and gate regions. The process of making the LDMOS transistor in this preferred embodiment is completed by forming metal contacts (not shown) to poly gate electrode 38, N+ source region 41, and N+ drain region 42, by use of known materials and methods, for example.

Figure 6:
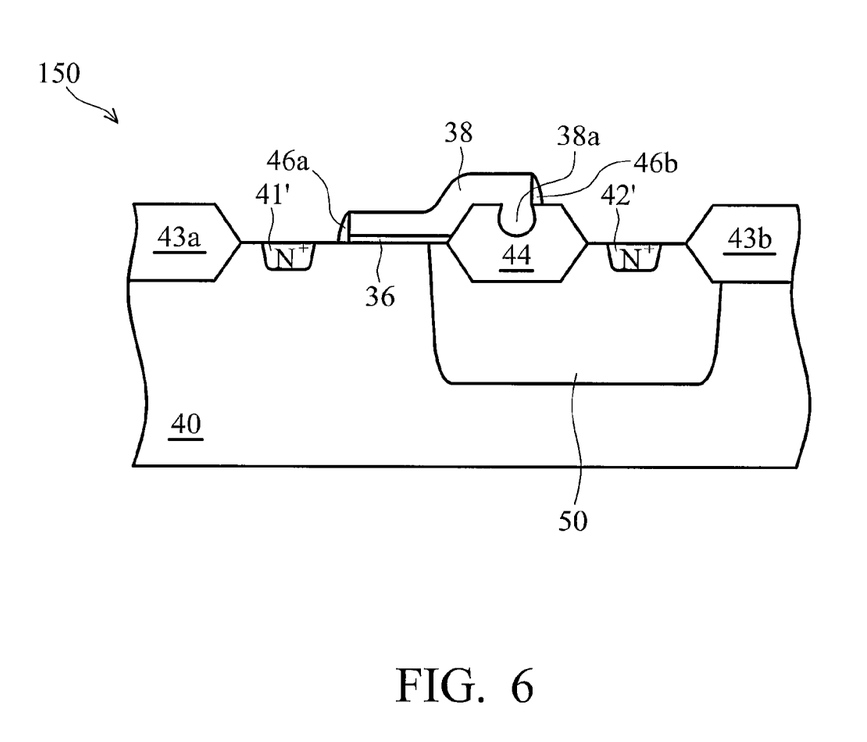
FIGS. 6-9 are cross-sectional views of illustrative embodiments of high voltage LDMOS transistors with gate electrode projection region.

FIG. 6 illustrates high voltage LDMOS transistor 150 in another embodiment. LDMOS transistor 150 has a similar device dimension to LDMOS transistor 100 shown in FIG. 2A. However, compared to the self-aligned N+ source/drain regions 41 and 42 of LDMOS transistor 100, the edges of N+ source region 41' are displaced from the edges of field oxide region 43a and spacer 46a, and the edges of N+ drain region 42' are displaced from the edges of field oxide regions 44 and 43b. As recognized by those skilled in the art, LDMOS transistor 150 provides an increased conductive path for the voltage to drop between the N+ source region 41' and N+ drain region 42', without increasing device dimensions. LDMOS transistor 150 may withstand a higher operational voltage than LDMOS transistor 100 of FIG. 2A.

Figure 7:
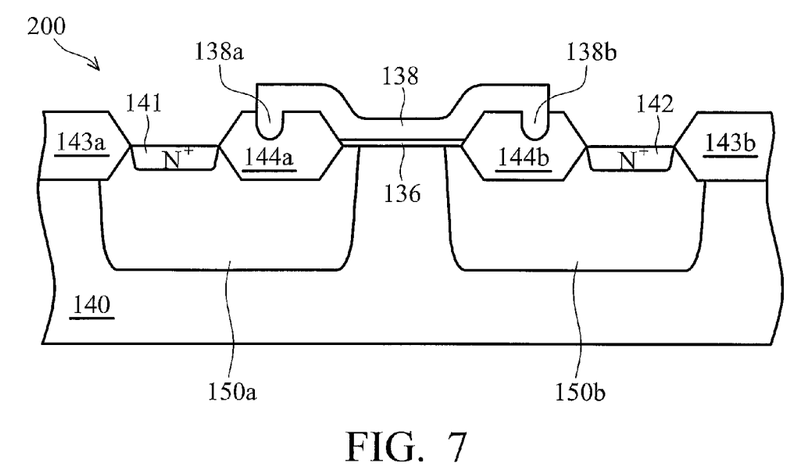

FIG. 7 illustrates N-channel enhanced mode, high voltage LDMOS transistor 200 in a further embodiment. Compared to the asymmetric device configuration of LDMOS transistor 100 shown in FIG. 2A, LDMOS transistor 200 has a symmetric device configuration. Gate poly layer 138 extends from a location on an upper boundary of field oxide region 144a, along a bird's beak of field oxide region 144a, the top surface of gate dielectric layer 136, and a bird's beak of field oxide region 144b, to a symmetric location on the upper boundary of field oxide region 144b. Further, convex-shaped poly tongue 138a at one end of gate poly layer 138 is disposed in a recess or groove in the upper boundary of field oxide region 144a, and poly tongue 138b at the other end of gate poly layer 138 is disposed in a recess or groove in the upper boundary of field oxide region 144b. The preferred dimensions of poly tongues 138a and 138b are similar to that of poly tongue 38a described with respect to FIG. 2A. In addition, field oxide 143a and 143b are used to isolate LDMOS transistor 200 from adjacent components on P-type substrate 140. Moreover, N+ source/drain regions 141 and 142 of LDMOS transistor 200 are aligned with the edges of field oxide regions 143a and 144a, and 144b and 143b, respectively. N− extension regions 150a and 150b are symmetrically formed, completely surrounding the portions of N+ source region 141 and field oxide region 144a, and the portions of N+ drain region 142 and field oxide region 144b, respectively. The doping concentration of N− extension regions 150a and 150b is similar to that of N− extension region 50 described with respect to FIG. 2A.

As one of the advantageous features, LDMOS transistor 200 of the current embodiment offers improved flexibility when used in a high voltage application. The symmetric configuration of LDMOS transistor 200 provides interchangeable source and drain regions, which facilitates its adoption to an increased variety of circuit configurations. In addition, the symmetric configuration of N− extension regions 150a and 150b leads to an increased off-breakdown voltage on source region 141, matching with that on drain region 142, as can be appreciated.

Figure 8:
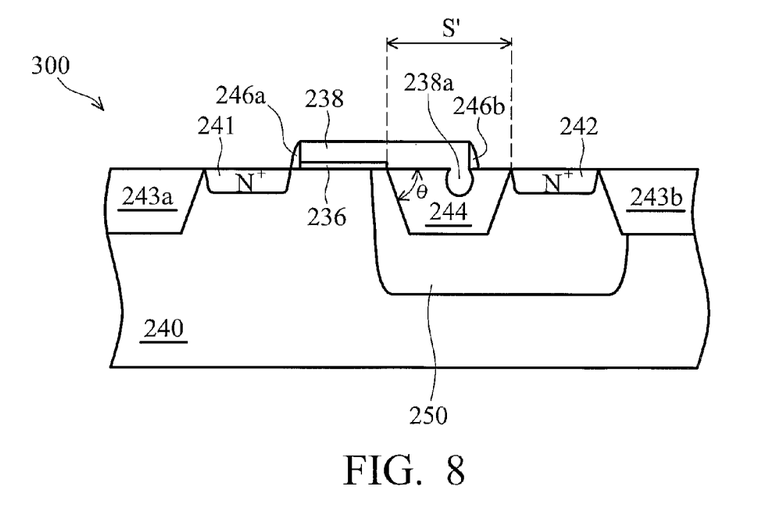

Shown in FIG. 8 is an N-channel enhanced mode, high voltage LDMOS transistor 300 in an additional/alternative embodiment of the current invention. LDMOS transistor 300 differs from LDMOS transistor 100, described with respect to FIG. 2A, in that shallow trench isolations (STI) are used in place of field oxide regions. Gate dielectric layer 236 extends from a location adjacent to an edge of the N+ source region 241, along the substrate surface, to a location abutting an edge of STI 244. Gate poly layer 238 extends from a location aligned with gate dielectric layer 236 at one end close to N+ source region 241, along the top surface of gate dielectric layer 36, to a location on the upper boundary of STI 244. Preferably, gate poly layer 238 extends on STI 244 to a location of about 50% of the lateral surface dimension S' of STI 244. Also, Gate poly layer 238 projects downwards into a convex-shaped recess or groove in the upper boundary of STI 244, forming tongue 238a. The preferred dimensions of poly tongue 238a is similar to that of poly tongue 38a described with respect to FIG. 2A. STIs 243a and 243b isolate LDMOS transistor 300 from adjacent components on P-type substrate 240. N+ source/drain regions 241 and 242 of LDMOS transistor 300 are aligned with the edges of STIs 243a and spacer 246a, and the edges of STIs 244 and 243b, respectively. N− extension region 250 completely surrounds the portions of N+ drain region 242 and STI 244.

Known process steps and materials may be used in forming the STIs in LDMOS transistor 300, which includes the process step of cutting trenches in substrate 240 by use of an anisotropic etch process, such as a plasma etch process. Preferably, STIs thus formed extend in substrate 240 to a depth from about 2.0 μm to about 5.0 μm. Also, a tapered trench profile is desired when cutting STI trenches in substrate 240. To obtain the desired effect in suppressing hot carrier effect, the acute angle "θ" between a trench sidewall and substrate 240 surface is preferably in the range from about 30 degrees to about 60 degrees, and more preferably, about 45 degrees.

Using STI 244 in an embodied LDMOS transistor 300 offers significant advantages. Firstly, a deeper extension of STI 244 in substrate 240 can be achieved without simultaneously creating the undesired surface topology, as in the case of forming field oxide 44 in FIG. 2A. A deeper extension of STI 244 translates into an increased conductive path between source and drain regions, which may, in turn, lead to a weaker peak electric field. Secondly, as known to those skilled in the art, a plasma etch process generally used to cut trenches of STIs provides better control in forming the desired angle between an STI sidewall and the substrate surface, whereas, local oxidation processes generally used in forming field oxide provide little control on the angle between a bird's beak and the substrate surface.

In preferred embodiments, field oxide region 44, 114a, 144b, and STI 244 may be commonly referred to as extension dielectric region. It will be well recognized by those skilled in the art that the LDMOS transistors in preferred embodiments described above can be fabricated by use of a conventional process flow of making a high voltage LDMOS transistor. The formation of the convex-shaped recess requires only one additional photolithography and selective etch process that is generally available in a conventional wafer processing facility, offering significant cost advantage. Additionally, various alternative materials and processing techniques exist in making the embodied LDMOS transistors, which facilitates fabricating the embodied LDMOS transistors in a large selection of manufacturing facilities.

Figure 9:
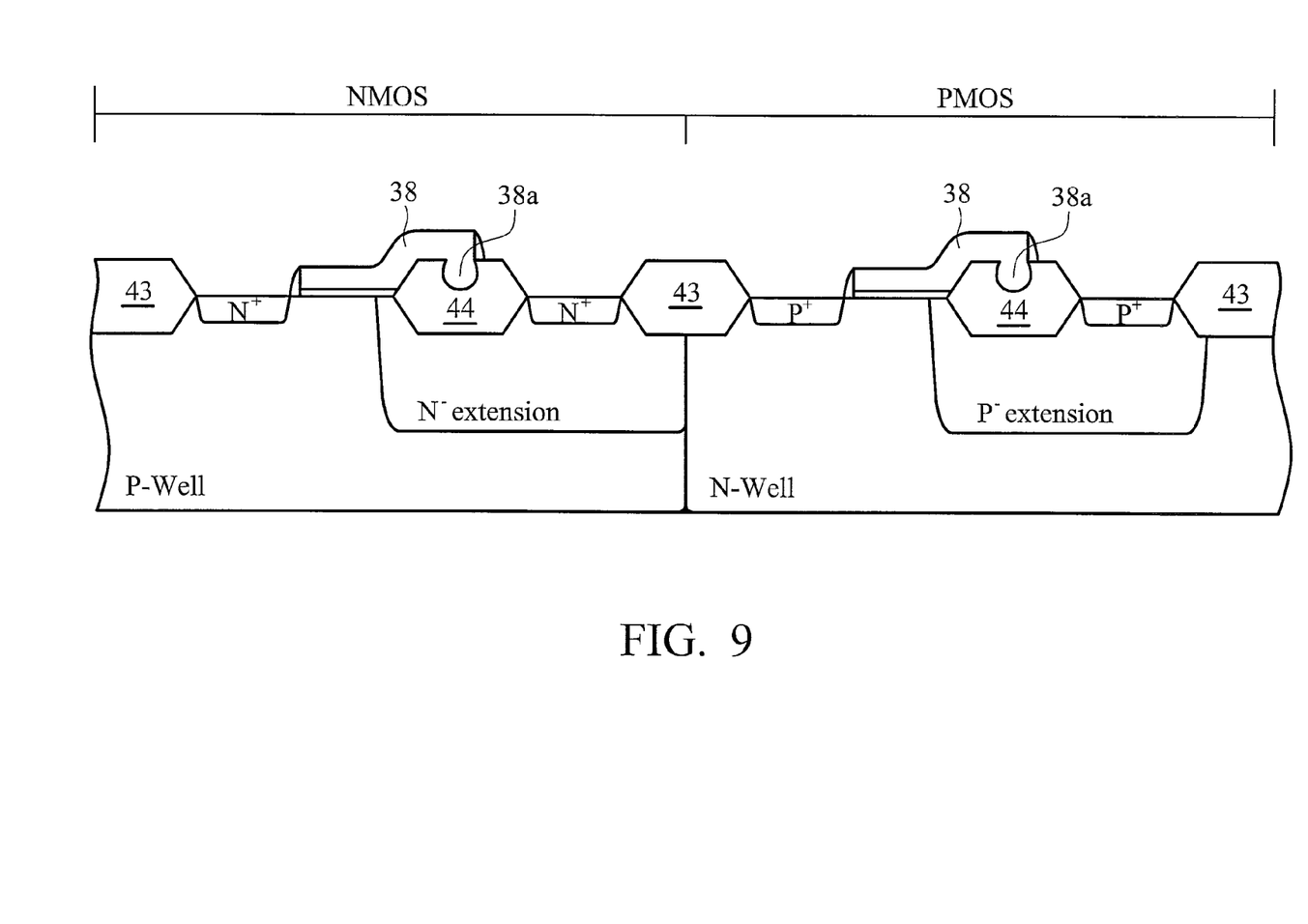

While N-channel LDMOS transistors are used in above preferred embodiments, it should be recognized by those skilled in the art that a high voltage P-channel LDMOS transistor, with a poly projection formed in a recess or groove in the field oxide or STI region, may also be made in accordance with the principles of the invention by providing substrate, source/drain regions, drain extension regions of the opposite doping type. The principles disclosed herein may apply to MOS transistors having other configuration, used for other applications, as well. As an example, additional embodiments can be readily contemplated through combining the various features in the preferred embodiments described above. Such additional embodiments include forming N-channel and P-channel LDMOS transistors of the preferred embodiments described above in ICs made of CMOS technology, such as those shown in FIG. 9 where field oxide 43 isolates NMOS and PMOS, while gate electrode projections 38a are formed into the upper surface of extension dielectric regions 44.

Although the present invention and its advantages have been described in detail, it should be understood that various changes, substitutions and alterations can be made herein without departing from the spirit and scope of the invention as defined by the appended claims. As another example, it will be readily understood by those skilled in the art that materials, process steps, process parameters in forming the preferred embodiments may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A MOS transistor disposed in a semiconductor substrate, the transistor comprising:
    a source region of a first conductivity type disposed in a first surface portion of the substrate;
    a drain region of the first conductivity type disposed in a second surface portion of the substrate;
    a channel region of a second conductivity type opposite the first conductivity type disposed in a third surface portion of the substrate between the source region and the drain region;
    a gate dielectric layer disposed over the channel region;
    an extension dielectric region laterally adjacent to and between the gate dielectric layer and the drain region;
    a drain extension region of the first conductivity type surrounding the drain region and the lower portion of the extension dielectric region; and
    a gate electrode having a first portion on the gate dielectric layer and a second portion on the upper surface of the extension dielectric region, wherein the second portion includes a convex projection into the upper surface of the extension dielectric region such that the extension dielectric region has a greater thickness on either side of the projection than below the projection, the projection being over the drain extension region and the second portion having a planar top surface that extends across the entire top of the projection.

2. The MOS transistor of claim 1 wherein the drain extension region of the first conductivity type completely surrounding the drain region and the lower portion of the extension dielectric region.

3. The MOS transistor of claim 1 wherein the substrate comprises P-type dopants, the source/drain regions and the drain extension region comprise N-type dopants, and the MOS transistor is an P-channel enhanced mode, high voltage Lateral-Diffused-Metal-Oxide-Semiconductor (LDMOS) transistor.

4. The MOS transistor of claim 1 wherein the extension dielectric region is a field oxide region having a thickness from about 4.0 µm to about 7.0 µm, and extends to a depth from about 1.5 µm to about 3.0 µm in the substrate.

5. The MOS transistor of claim 4 wherein an acute angle between bird's beak of the field oxide and the surface of the substrate is in the range from about 30 degrees to about 60 degrees.

6. The MOS transistor of claim 1 wherein the extension dielectric region is a shallow trench isolation (STI) region extending to a depth from about 2.0 µm to about 5.0 µm in the substrate.

7. The MOS transistor of claim 6 wherein an acute angle between an sidewall of the STI and the surface of the substrate is in the range from about 30 degrees to about 60 degrees.

8. The MOS transistor of claim 1 wherein the gate electrode comprises a polysilicon (poly) layer, and the projection of the second portion of the gate electrode has a convex shape.

9. The MOS transistor of claim 8 wherein the poly layer has a thickness from about the 2.0 µm to about 5.0 µm, and the convex-shaped projection of the poly gate electrode has a lateral dimension from about 100 Å to about 500 Å and a vertical dimension from about 200 Å to about 600 Å.

10. The MOS transistor of claim 1 wherein the drain region is substantially aligned with the extension dielectric region.

11. A MOS transistor disposed in a semiconductor substrate, the transistor comprising:
    a source region of a first conductivity type disposed in a first surface portion of the substrate;
    a drain region of the first conductivity type disposed in a second surface portion of the substrate;
    a channel region of a second conductivity type opposite the first conductivity type disposed in a third surface portion of the substrate between the source region and the drain region;
    a gate dielectric layer disposed over the channel region;
    an extension dielectric region laterally adjacent to and between the gate dielectric layer and the drain region, the extension dielectric region having a convex-shaped recess on an upper surface, wherein the convex-shaped recess has a convex surface facing in a direction perpendicular to a current flow in the channel region;
    a drain extension region of the first conductivity type surrounding the drain region and the lower portion of the extension dielectric region, the drain extension region being located beneath the entire convex-shaped recess; and
    a gate electrode covering the gate dielectric layer and a portion of the extension dielectric region, and completely filling the convex-shaped recess.

12. The MOS transistor of claim 11 further comprising a first isolation region, a second isolation region, and a spacer on a sidewall of the gate electrode, wherein the source region is substantially aligned with the spacer and the first isolation region, and wherein the drain region is substantially aligned with the extension dielectric region and the second isolation region.

13. The MOS transistor of claim 11 wherein the convex-shaped recess comprises a groove with rounded sidewalls, the groove extending longitudinally along a channel width direction.

14. The MOS transistor of claim 11 wherein the substrate comprises an P-well formed in a semiconductor workpiece, the source/drain regions and the drain extension region comprise N-type dopants, and the MOS transistor is a P-channel, high voltage LDMOS transistor.

15. The MOS transistor of claim 11 wherein the extension dielectric region is a shallow trench isolation (STI) region, extending to a depth from about 2.0 µm to about 5.0 µm in the substrate.

16. The MOS transistor of claim 11 wherein the extension dielectric region is a field oxide region, extending to a depth from about 1.5 µm to about 3.0 µm in the substrate.

17. The MOS transistor of claim 11 wherein the convex-shaped recess has a lateral dimension from about 100 Å to about 500 Å and a vertical dimension from about 200 Å to about 600 Å.

18. A MOS transistor disposed in a semiconductor substrate, the transistor comprising:

a source region of a first conductivity type disposed in a first surface portion of the substrate;

a drain region of the first conductivity type disposed in a second surface portion of the substrate;

a channel region of a second conductivity type opposite the first conductivity type disposed in a third surface portion of the substrate between the source region and the drain region;

a gate dielectric layer disposed over the channel region;

a first extension dielectric region laterally adjacent to and between the gate dielectric layer and the source region, the first extension dielectric region having a first recess located over a first portion, the first portion extending into the substrate, the first recess having opposing sidewalls extending towards the substrate;

a second extension dielectric region laterally adjacent to and between the gate dielectric layer and the drain region, the second extension dielectric region having a second portion extending into the substrate;

a source extension region of the first conductivity type surrounding the source region and the first portion of the first extension dielectric region;

a drain extension region of the first conductivity type surrounding the drain region and the second portion of the second extension dielectric region; and a gate electrode having a first portion on the upper surface of the first extension dielectric region and a second portion on the upper surface of the second extension dielectric region, wherein the first portion of the gate electrode includes a first projection into the first recess, and the second portion includes a second projection into the second extension dielectric region.

19. The MOS transistor of claim 18 wherein the first and the second extension dielectric regions are STI regions extending into the substrate.

20. The MOS transistor of claim 18 wherein the gate electrode comprises poly, and the first projection and the second projection of the poly gate electrode each have a convex shape.

* * * * *